United States Patent
Hackett (10) Patent No.: US 12,416,659 B2
(45) Date of Patent: Sep. 16, 2025

(54) METHOD AND DEVICE FOR FAULT DETECTION

(71) Applicant: Silergy Semiconductor Technology (Hangzhou) LTD, Hangzhou (CN)

(72) Inventor: Nathan Hackett, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 436 days.

(21) Appl. No.: 17/965,089

(22) Filed: Oct. 13, 2022

(65) Prior Publication Data

US 2023/0130108 A1 Apr. 27, 2023

(30) Foreign Application Priority Data

Oct. 25, 2021 (CN) .......................... 202111242269.7

(51) Int. Cl.
*G01R 31/08* (2020.01)
(52) U.S. Cl.
CPC .................. *G01R 31/088* (2013.01)
(58) Field of Classification Search
None
See application file for complete search history.

(56) References Cited

U.S. PATENT DOCUMENTS

| | | | |
|---|---|---|---|
| 5,043,913 | A | 8/1991 | Furutani |
| 5,068,662 | A | 11/1991 | Guddanti et al. |
| 5,161,014 | A | 11/1992 | Pearson et al. |
| 5,247,605 | A | 9/1993 | Engeler |
| 5,455,583 | A | 10/1995 | Stryjewski |
| 5,532,950 | A | 7/1996 | Moses et al. |
| 7,345,604 | B2 | 3/2008 | Watson |
| 8,234,227 | B2 | 7/2012 | Smallridge |
| 9,213,937 | B2 | 12/2015 | Ponulak |
| 9,791,496 | B2 | 10/2017 | Sharma et al. |
| 10,880,967 | B2 * | 12/2020 | Zheng ..................... H05B 45/59 |
| 2013/0151450 | A1 | 6/2013 | Ponulak |

* cited by examiner

Primary Examiner — Farhana A Hoque (57) ABSTRACT

A method of performing fault detection can include: performing a sampling operation to obtain a first voltage signal and a first current signal from a circuit path; performing a phase adjustment on the first voltage signal and the first current signal to generate a second voltage signal and a second current signal; transmitting the second voltage signal and the second current signal to a fault detection network that is pre-trained to accordingly process and generate a fault detection result; and operably disconnecting the circuit path when a fault is detected based on the fault detection result.

15 Claims, 5 Drawing Sheets

METHOD AND DEVICE FOR FAULT DETECTION

RELATED APPLICATIONS

This application claims the benefit of Chinese Patent Application No. 202111242269.7, filed on Oct. 25, 2021, which is incorporated herein by reference in its entirety.

FIELD OF THE INVENTION

The present invention generally relates to the field of electronic power technology, and more particularly to methods and devices for fault detection.

BACKGROUND

The popularity of electrical equipment in daily life is increasing, which may improve the convenience of daily life and work. Due to various reasons, such as lack of standardized regulation in electricity usage, many safety hazards have also emerged. At present, most fault protections for power distribution systems rely on fuses, which are focused on the problems of over-currents, over-loadings, and leakages in the power lines. In actual working conditions, miss detections and false detections are frequent problems due to the influence of the complexity of environment and load types.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
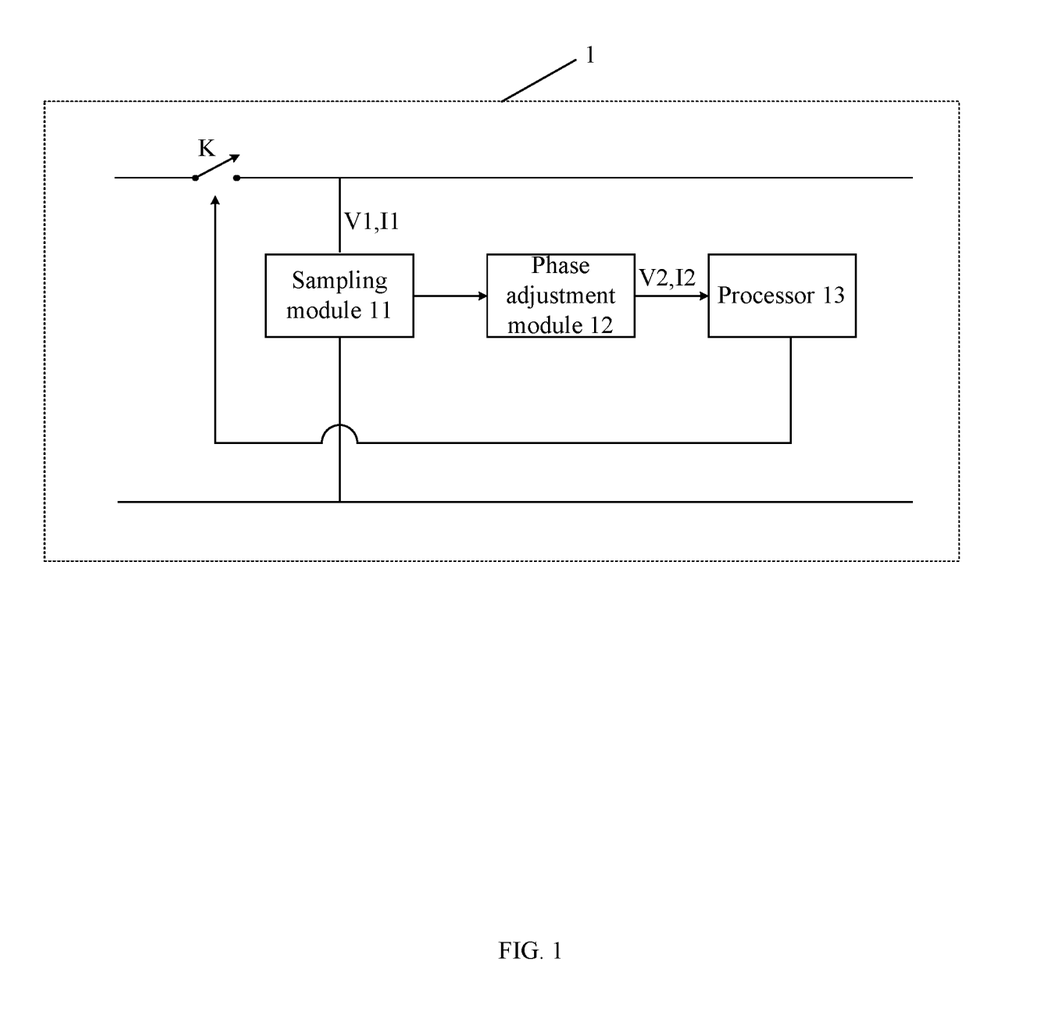
FIG. 1 is a schematic block diagram of a first example fault detection device, in accordance with embodiments of the present invention.

Referring now to FIG. 1, shown is a schematic block diagram of a first example fault detection device, in accordance with embodiments of the present invention. In this particular example, fault detection device 1 can include sampling module 11, phase adjustment module 12, and processor 13. In this example, sampling module 11 can sample from the circuit path to acquire voltage signal V1 and current signal I1. Phase adjustment module 12 can perform phase adjustments on voltage signal V1 and current signal I1 to generate voltage signal 12 and current signal 12. Processor 13 can transmit voltage signal V2 and current signal 12 into a fault detection network pre-trained for processing and obtaining a fault detection result, and operably control the connectivity of the circuit path according to the fault detection result.

In another example, voltage signal V2 and current signal 12 can be processed by a discrete Fourier transformation (DFT) before being transmitted into the fault detection network, such that the spectrum information of voltage signal V2 and current signal 12 are processed to obtain the fault detection result. For example, the spectrum information can include phase information and amplitude information. In particular embodiments, the spectrum information may also include frequency information of electrical signals (voltage signal and current signal).

In this example, if the fault detection result shows that there is a fault in the circuit path, switch K can be controlled to be disconnected to ensure the electricity safety. In another example, a fuse or other control circuit may be employed to control switch K to ensure the safety of power usage in the event of a fault. In yet another example, the fault detection network is a neural network, and any suitable type of neural network can be utilized in certain embodiments, such as convolutional neural network (CNN) or recurrent neural network (RNN). In particular embodiments, phase adjustments can be performed on the current signal and voltage signal sampled from the circuit path, and the fault detection network can detect whether there is a fault in a circuit based on the phase information and the amplitude information of the current signal and the voltage signal in the circuit path, thereby improving the accuracy of fault detection.

Figure 2:
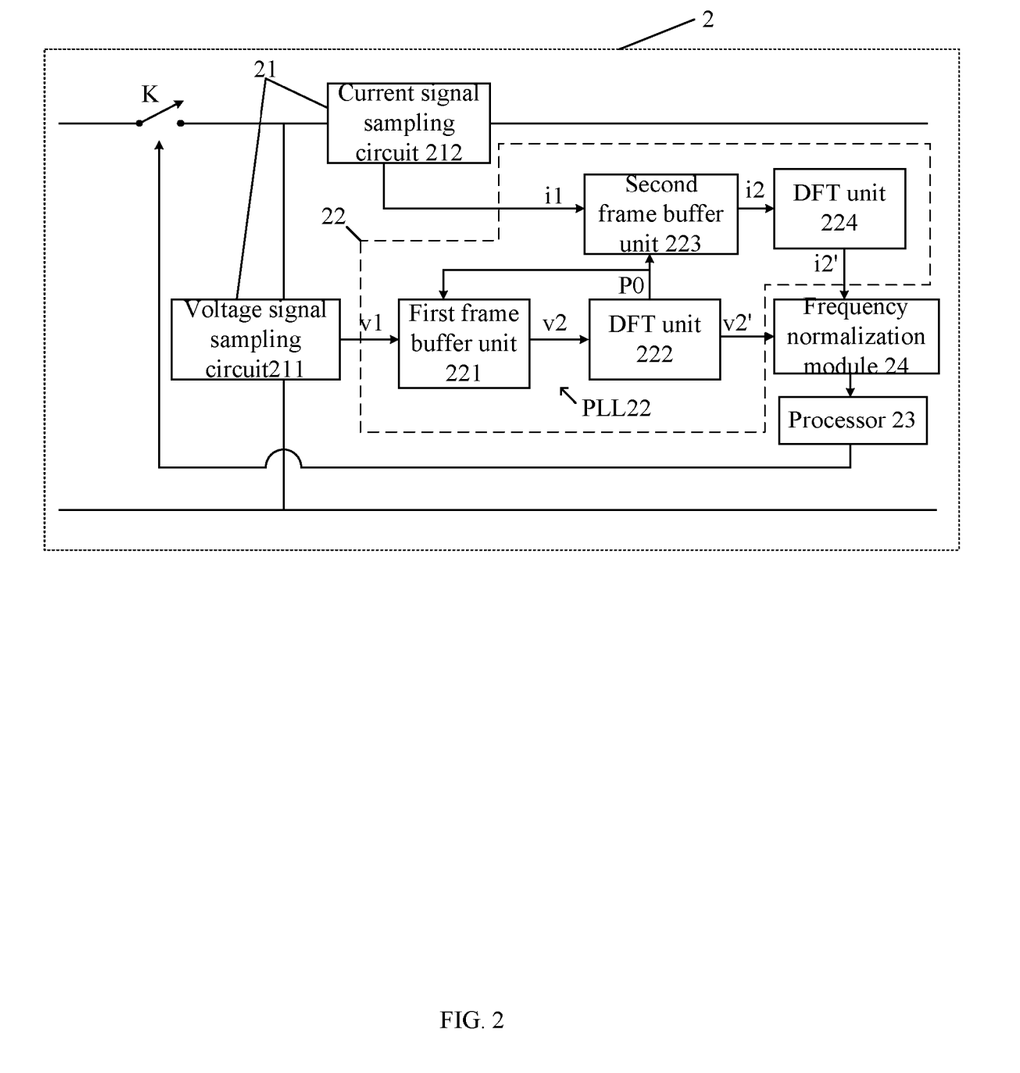
FIG. 2 is a schematic block diagram of a second example fault detection device, in accordance with embodiments of the present invention.

Referring now to FIG. 2, shown is a schematic block diagram of a second example fault detection device, in accordance with embodiments of the present invention. In this particular example, sampling module 21 can include voltage signal sampling circuit 211 and current signal sampling circuit 212. Voltage signal sampling circuit 211 can sample from the circuit path to acquire voltage signal v1, whereas current signal sampling circuit 212 can sample from the circuit path to acquire current signal i1.

In another example, the phase adjustment module 22 can include a phase locker PLL22. Phase locker PLL22 can determine a fundamental frequency $f_0$ of voltage signal v1, and obtain phase information P0 of voltage signal v1 corresponding to fundamental frequency $f_0$. Voltage signal v1 and current signal i1 are under phase adjustments based on phase information P0 of voltage signal v1 corresponding to fundamental frequency $f_0$, such that the phase of voltage signal v2 is maintained at zero. In the process of electrical signal transmission, electrical signals are inevitably accompanied with harmonic components. Therefore, the fundamental frequency $f_0$ of voltage signal v1 can be initially determined. For example, the fundamental frequency of the power grid is generally 50 Hz. In this example, a spectrum analyzer may be used to measure the fundamental frequency of voltage signal v1. Alternatively, a frequency counter may be used to measure the frequency of the lowest frequency wave in voltage signal v1 to determine the fundamental frequency. Any suitable methods for determining the fundamental frequency can be utilized in certain embodiments.

For example, frame buffer unit 221 and DFT unit 222 may form phase locker PLL22. For example, frame buffer unit 221 can be coupled to the voltage signal sampling circuit 211, receiving and buffering samples of voltage signal v1 for at least one DFT cycle, which may be subsequently processed in DFT unit 222. DFT unit 222 can be coupled to frame buffer unit 221, and can perform the discrete Fourier transformation on the buffered samples of voltage signal v1 output from frame buffer unit 221 to obtain the instant phase information. The instant phase information may be feedback to frame buffer unit 221, and frame buffer unit 221 can accordingly perform the phase adjustment on voltage signal v1. The operation may be repeated until phase information P0 corresponding to fundamental frequency $f_0$ is determined.

In another example, phase adjustment module 22 can perform the phase adjustment on the voltage signal and current signal sampled from the circuit path with the following steps. Voltage signal v1 being sampled from the circuit path may be expressed as:

$$v1(t) = A \cos(\omega_0 t + \Phi) \quad (1)$$

Here, A is the amplitude of voltage signal v1, $\omega_0 = 2\pi f_0$, where $f_0$ is the fundamental frequency of voltage signal v1, and $\Phi$ is the phase of voltage signal v1 under the fundamental frequency $f_0$. That is, P0 is assumed to be $\Phi$. Optionally, voltage signal v1 in the above expression (1) can be converted into an exponential expression using Euler's identity as shown below.

$$v1(t) = \left(\frac{A}{2}e^{i\Phi}\right)e^{i\omega_0 t} + \left(\frac{A}{2}e^{-i\Phi}\right)e^{-i\omega_0 t} \quad (2)$$

In this example, frame buffer unit 221 may buffer a sufficient number of samples of voltage signal v1 (e.g., the amount of voltage signal samples cumulated for at least one DFT cycle), allowing a predetermined DFT window to be used for the discrete Fourier transformation. DFT unit 222 can perform a discrete Fourier transformation on the buffered samples of voltage signal v1 to obtain transformed voltage signal $X(\omega)$ as shown below:

$$X(\omega) = \sum_{t=0}^{N-1} v(t)e^{-i\omega t} \quad (3)$$

Here, N is the size of the DFT window, that is, the number of sample points. Voltage signal v1 in the exponential expression (2) may be substituted into Equation (3) as follows:

$$X(\omega_0) = \sum_{t=0}^{N-1} \left(\left(\frac{A}{2}e^{i\Phi}\right)e^{i\omega_0 t} + \left(\frac{A}{2}e^{-i\Phi}\right)e^{-i\omega_0 t}\right)e^{-i\omega_0 t} \quad (4)$$

$$= \sum_{t=0}^{N-1} \left(\left(\frac{A}{2}e^{i\Phi}\right) + \left(\frac{A}{2}e^{-i\Phi}\right)e^{-i2\omega_0 t}\right)$$

$$= \sum_{t=0}^{N-1} \left(\frac{A}{2}e^{i\Phi}\right) + \sum_{t=0}^{N-1} \left(\left(\frac{A}{2}e^{-i\Phi}\right)e^{-i2\omega_0 t}\right)$$

-continued $$= \sum_{t=0}^{N-1}\left(\frac{A}{2}e^{i\Phi}\right)$$

Here, fundamental frequency $f_0$ is not zero, so $\omega_0$ is not 0, and the number of sample points N is large enough, hence:

$$\sum_{t=0}^{N-1}\left(\left(\frac{A}{2}e^{-i\Phi}\right)e^{-i2\omega_0 t}\right) = 0$$

The result of the discrete Fourier transformation may further be converted using Euler's identity to yield the follows:

$$(\omega_0) = \frac{NA}{2}\cos(\Phi) + i\frac{NA}{2}\sin(\Phi) \quad (5)$$

Let $a_{\omega_0}$ be the real part of the expression (5) and $b_{\omega_0}$ the imaginary part of the expression (5), then:

$$\frac{b_{\omega_0}}{a_{\omega_0}} = \frac{\frac{NA}{2}\sin(\Phi)}{\frac{NA}{2}\cos(\Phi)} = \tan(\Phi) \quad (6)$$

$$\Phi = \tan^{-1}\left(\frac{b_{\omega_0}}{a_{\omega_0}}\right) \quad (7)$$

Thus, particular embodiments may enable determination of the phase $\Phi$ of voltage signal v1 corresponding to the fundamental frequency after performing a discrete Fourier transformation on voltage signal v1 sampled from the circuit path. In this example, frame buffer unit 221 can shift the buffered samples of voltage signal v1 based on phase information P0 determined by DFT unit 222, such that the phase of voltage signal v1 is adjusted. Assuming that frame buffer unit 221 is phase shifted for ($-\Phi$), the expression of the phase-adjusted voltage sample (e.g., voltage signal V2) becomes:

$$v2(t) = A \cos(\omega_0 t + \Phi - \Phi) = A \cos(\omega_0 t) \quad (8)$$

DFT unit 222 thereafter may perform a discrete Fourier transformation on voltage signal v2 to obtain discrete voltage signal v2'. The phase information corresponding to the fundamental frequency can be determined to accordingly perform phase adjustments on the electrical signal samples. The phase information corresponding to the fundamental frequency may be employed as a reference for all harmonic waves and noise phases, such that the fault detection network configured in processor 23 is less sensitive to phase fluctuations caused by the input frequency of the electrical signals. Thus, the phase information and amplitude information in the electrical signal samples can be applicable in the fault detection network, which may significantly increase the amount of information adaptable for the fault detection network, thereby improving the efficiency of fault detection.

In another example, fault detection device 2 can also include a second frame buffer unit 223 and a DFT unit 224. For example, frame buffer unit 223 can be coupled to DFT unit 222 and current sampling module 212 for buffering samples of current signal i1 for at least one DFT cycle, and may accordingly perform a phase adjustment on current signal i1 based on the aforementioned phase information P0 to obtain current signal i2. DFT unit 224 can perform a discrete Fourier transformation on current signal i2 to respectively obtain a discrete current signal i2'.

The electrical signals in a frame buffer may be shifted to adjust phases of electrical signal samples. It should be understood that other signal processing methods, such as through the Hilbert filter, may also be applicable for phase adjustments, and any suitable approach for phase adjustments can be utilized in certain embodiments. In one application, the sampling clocks for voltage sampling and current sampling may have phase differences, which may affect the fault detection result. Thus, frame buffer unit 223 can further perform phase adjustments on current signal i1 according to a phase difference when the phase difference is occurred between the sampling clocks in voltage sampling circuit 211 and current sampling circuit 212. The influences of clock differences in sampling for the electrical signals may therefore be eliminated to further improve the accuracy of fault detection.

In another example, if there is no consistent phase correlation between the sampling clock of the electrical signal and the frequency of the electrical signal, random phase information can be generated depending on application scenarios, and the phase adjustment may be performed on the voltage signal and current signal according to the random phase information. The voltage signal and current signal after phase adjustment may then be used in the fault detection. Thus, more viable information can be submitted to the fault detection network to improve the accuracy of fault detection.

In another example, when the fundamental frequency of the electrical signal is variable or undeterminable, fluctuations of the fundamental frequency may affect the fault detection results. Thus in particular embodiments, a normalization on the frequency of the electrical signal can be used to avoid the consequences induced by the undeterminable fundamental frequency fluctuation. The accuracy of fault detection may therefore be further improved. For example, fault detection device 2 can also include a frequency normalization module 24. Frequency normalization module 24 can be coupled to DFT unit 222 and DFT unit 224, and may perform a spectrogram scaling using interpolation filtering or spline interpolation on voltage signal v2' and current signal i2' transformed from the discrete Fourier transformation, in order to normalize the frequencies of voltage signal v2' and current signal i2'.

Processor 23 may receive the scaled spectrogram of the voltage signal and the current signal, and may allow the fault detection network to process the phase information, amplitude information and frequency information in the spectrogram of the voltage signal and the current signal, such that a fault detection result can be obtained. When the fault is detected, switch K in the circuit path can be operably disconnected to ensure electrical safety. In another example, the fault detection network is a neural network, and any suitable type of neural network (e.g., CNN, RNN, etc.) can be utilized in certain embodiments. It should also be understood that the training mechanism is applicable to any suitable fault detection method. When faults are asserted, the changes in phase, amplitude, frequency and the like, may be inferenced by the neural network to determine the fault.

In another example, fault detection device 2 can include processor 23 (e.g., a digital signal processor [DSP], an application-specific integrated circuit [ASIC], a programmable logic device [PLD], etc.). In this example, fault detection device 2 can execute corresponding logic instructions in frame buffer unit 221, DFT unit 222, frame buffer unit 223, DFT unit 224, frequency normalization module 24, and other processing units, in order to process the voltage signal and current signal in the circuit path. For example, the above processing units may be separate program modules executable by processor 23 in order to realize corresponding functions. On the other hand, the aforementioned processing units may be hardwired circuit structures with predetermined connection schemes in order to carry out respective functions.

Voltage signal v1 and current signal i1 can be acquired by performing a sampling operation on a circuit path. The phases of voltage signal v1 and current signal i1 can be adjusted into voltage signal v2 and current signal i2, respectively. Voltage signal v2 and current signal i2 can be transmitted to a fault detection network pre-trained for processing and obtaining a fault detection result. When the fault detection result indicates the presence of a fault, the circuit path can be operably disconnected. Therefore, particular embodiments may be advantageous for allowing a circuit fault to be detected based on phase information and amplitude information of current and voltage signals in the circuit path with improved accuracy of detection.

Figure 3:
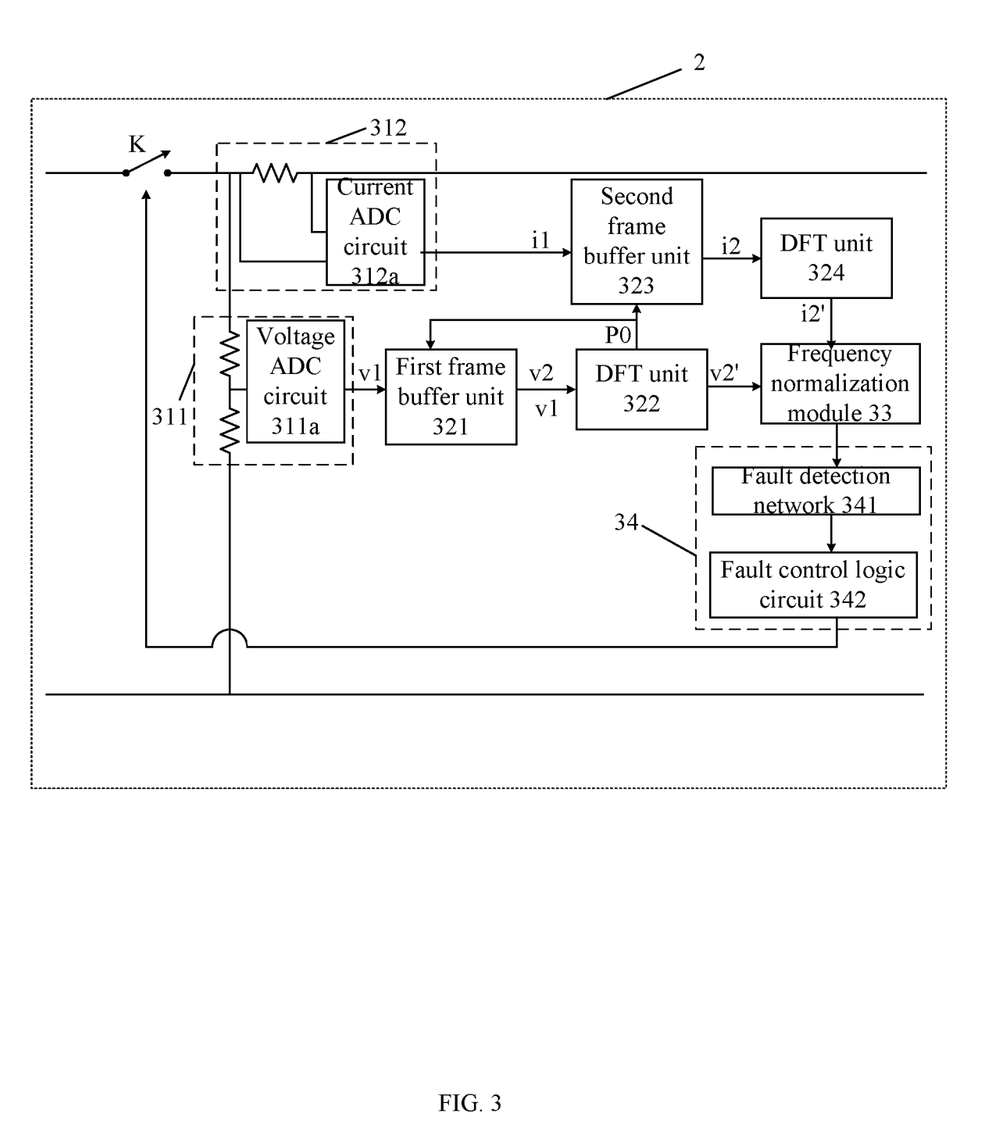
FIG. 3 is a schematic block diagram of a third example fault detection device, in accordance with embodiments of the present invention.

Referring now to FIG. 3, shown is a schematic block diagram of a third example fault detection device, in accordance with embodiments of the present invention. In this particular example, voltage sampling circuit 311 can include a voltage divider circuit and voltage ADC circuit 311a. For example, the voltage divider circuit can connect to the circuit path to facilitate voltage detection, and voltage ADC circuit 311a may sample voltage signal v1 from the voltage divider circuit. Sampling rate fsv can be configured depending on practical scenarios in specific applications. Current sampling circuit 312 can include a shunt resistor and current ADC circuit 312a. For example, the shunt resistor can connect in series in the circuit path to facilitate current detection, and it should be understood that the voltage across the shunt resistor can represent the current flowing through the circuit path. Current ADC circuit 312a may sample current signal i1 from the shunt resistor. Sampling rate fsa can be configured based on practical scenarios in specific applications. In one example, the sampling clocks for voltage sampling circuit 311 and current sampling circuit 312 can be identical.

Voltage ADC circuit 311a can transmit sampled voltage signal v1 to frame buffer unit 321. Frame buffer unit 321 can buffer the samples of voltage signal v1 for at least one DFT cycle, and may transmit the buffered samples of voltage signal v1 to DFT unit 322. DFT unit 322 can be arranged to perform a discrete Fourier transformation on the received the buffered samples of voltage signal v1, in order to obtain the instant phase information thereof. Thereafter, the instant phase information may be feedback to frame buffer unit 321, allowing frame buffer unit 321 to accordingly adjust the phase of voltage signal v1. The feedback operation can be repeated until phase information P0 corresponding to fundamental frequency $f_0$ is determined.

DFT unit 322 can also receive voltage signal v2 after phase adjustment from frame buffer unit 321, and may perform discrete Fourier transformation on voltage signal v2 to generate voltage signal v2'. A spectrogram of voltage signal in the circuit path can thereby the obtained. Current ADC circuit 312a may transmit sampled current signal i1 to frame buffer unit 323. Frame buffer unit 323 may receive current signal i1 and phase information P0 from DFT unit 322. Frame buffer unit 323 can adjust the phase of current signal i1 according to phase information P0, and may transmit a plurality of phase adjusted current signal i1 collected during at least one DFT cycle to DFT unit 324.

In another example, the sample clocks for voltage sampling and current sampling may have phase differences. Frame buffer unit 323 may further adjust the phase of current signal i1 according to the phase differences between voltage sampling circuit 311 and current sampling circuit 312, in order to eliminate the influences caused by the difference of sampling clocks for sampling the electrical signal, and to further improve the accuracy of fault detection. DFT unit 324 may receive phase adjusted current signal i2 from frame buffer unit 323, and can convert current signal i2 to current signal i2' via DFT conversion to obtain a spectrogram of current signal in the circuit path.

In particular embodiments, the phase adjustment may be performed on electrical signals by shifting the electrical signals in a frame buffer. It should be understood that other signal processing methods, such as through the Hilbert filter, may also be utilized for phase adjustments in certain embodiments. The phase information corresponding to the fundamental frequency can be determined to accordingly perform phase adjustments on the electrical signal samples. The phase information corresponding to the fundamental frequency may be employed as a reference for all harmonic waves and noise phases, such that the fault detection network configured in processor 23 is less sensitive to phase fluctuations caused by the input frequency of the electrical signal. Thus, the phase information and amplitude information in the electrical signal samples can be applicable in the fault detection network, which can significantly increase the amount of information adaptable for the fault detection network, thereby improving the efficiency of fault detection.

In another example, if there is no consistent phase correlation between the sampling clock of the electrical signal and the frequency of the electrical signal, random phase information can be generated depending on application scenarios, and the phase adjustment may be performed on the voltage signal and current signal according to the random phase information. The voltage signal and current signal after phase adjustment may then be used in the fault detection. Thus, more viable information can be submitted to the fault detection network in order to improve the accuracy of fault detection.

In another example, when the fundamental frequency of the electrical signal is variable or undeterminable, fluctuations of the fundamental frequency may affect the fault detection results. Thus in particular embodiments, a normalization on the frequency of the electrical signal can be provided to avoid the consequences induced by the undeterminable fundamental frequency fluctuation. The accuracy of fault detection may thereby be further improved. For example, frequency normalization module 33 may receive a spectrogram of voltage signal v2' provided from DFT unit 322, and a spectrogram of current signal i2' may be provided from DFT unit 324. A spectrogram scaling can be performed using interpolation filtering or spline interpolation on the received spectrograms to normalize the frequencies of voltage signal v2' and current signal i2'.

Fault detection network 341 in processor 34 may receive the scaled voltage signal spectrogram and the current signal spectrogram, such that the fault detection network processes the phase information, amplitude information, and frequency information in the voltage signal spectrogram and the current signal spectrogram, in order to obtain the fault detection result. Fault control logic circuit 342 in processor 34 may receive the fault detection result. When a fault is detected, switch K in the circuit path can be operably disconnected to ensure the electrical safety. In another example, the fault detection network is a neural network (e.g., CNN, RNN, etc.).

In particular embodiments, a first voltage signal and a first current signal can be sampled by performing a sampling operation on a circuit path. Phases of the first voltage signal and the first current signal may be adjusted to obtain a second voltage signal and a second current signal. The second voltage signal and the second current signal can be transmitted to a fault detection network pre-trained for processing and obtaining a fault detection result. When the fault detection result indicates presence of a fault, the circuit path can be operably disconnected. Therefore, particular embodiments may be advantageous for allowing a circuit fault to be detected based on phase information and amplitude information of the current signal and voltage signal in the circuit path with improved accuracy of detection.

Figure 4:
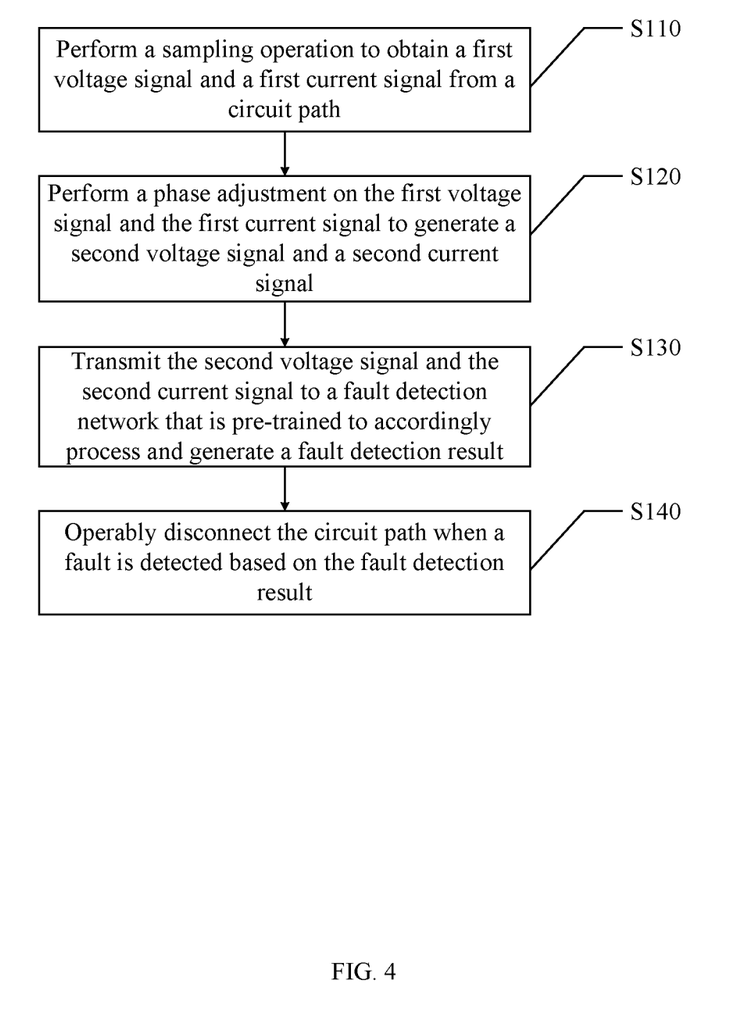
FIG. 4 is a flow diagram of an example fault detection method, in accordance with embodiments of the present invention.

Referring now to FIG. 4, shown is a flow diagram of an example fault detection method, in accordance with embodiments of the present invention. In this example, the fault detection method can include, at S110, a sampling operation being performed to obtain a first voltage signal and a first current signal from a circuit path. In this example, the voltage signal and the current signal in the circuit path can be respectively obtained by a voltage sampling circuit and a current sampling circuit.

In S120, phase adjustments may respectively be performed on the first voltage signal and the first current signal to generate a second voltage signal and a second current signal. For example, S120 can include the following: determining a fundamental frequency of the first voltage signal; acquiring phase information of the first voltage signal corresponding to the fundamental frequency; and adjusting phases of the first voltage signal and the first current signal according to the phase information.

The phase information corresponding to the fundamental frequency can be determined to accordingly perform phase adjustments on the electrical signal samples. The phase information corresponding to the fundamental frequency may be employed as a reference for all harmonic waves and noise phases, such that the fault detection network is less sensitive to phase fluctuations caused by the input frequency of the electrical signal. Thus, the phase information and amplitude information in the electrical signal samples can be applicable in the fault detection network, which may significantly increase the amount of information adaptable for the fault detection network, thereby improving the efficiency of fault detection.

In another example, obtaining the phase information of the first voltage signal corresponding to the fundamental frequency can include performing a discrete Fourier transformation on the first voltage signal to obtain the phase information of the first voltage signal. In another example, S120 can also include the following steps. When a phase difference exists between a sampling clock of the first voltage signal and a sampling clock of the first current signal, a phase adjustment can be performed on the first current signal according to the phase difference. As a result, the influences of clock differences in electrical signal sampling may be mitigated, and the accuracy of fault detection further improved.

In another example, S120 can also include the following steps. When sample rates for the first voltage signal and the first current signal do not have consistent phase correlations with an operation frequency in the circuit path, the phase adjustment for the first current signal can be performed using a random phase. As a result, the fault detection network may be allowed to make use of more viable information, and thus the accuracy of fault detection improved.

In S130, the second voltage signal and the second current signal can be transmitted to the fault detection network pre-trained to process and obtain the fault detection result. In S140, when the fault detection result indicates a presence of a fault, the circuit path can be operably disconnected. Optionally, S130 can also include the following steps. A frequency normalization may be performed on the second voltage signal and the second current signal. The second voltage signal and the second current signal after the frequency normalization can be transmitted to the fault detection network for processing and obtaining the fault detection result.

Optionally, a spectrogram scaling can be performed on the second voltage signal and the second current signal through interpolation filtering or spline interpolation to normalize frequencies of the second voltage signal and the second current signal. The steps are advantageous for avoiding the influences caused by undeterminable fundamental frequency variations, which may further improve the accuracy of fault detection. In this example, the fault detection network is a neural network (e.g., CNN, RNN, etc.).

Figure 5:
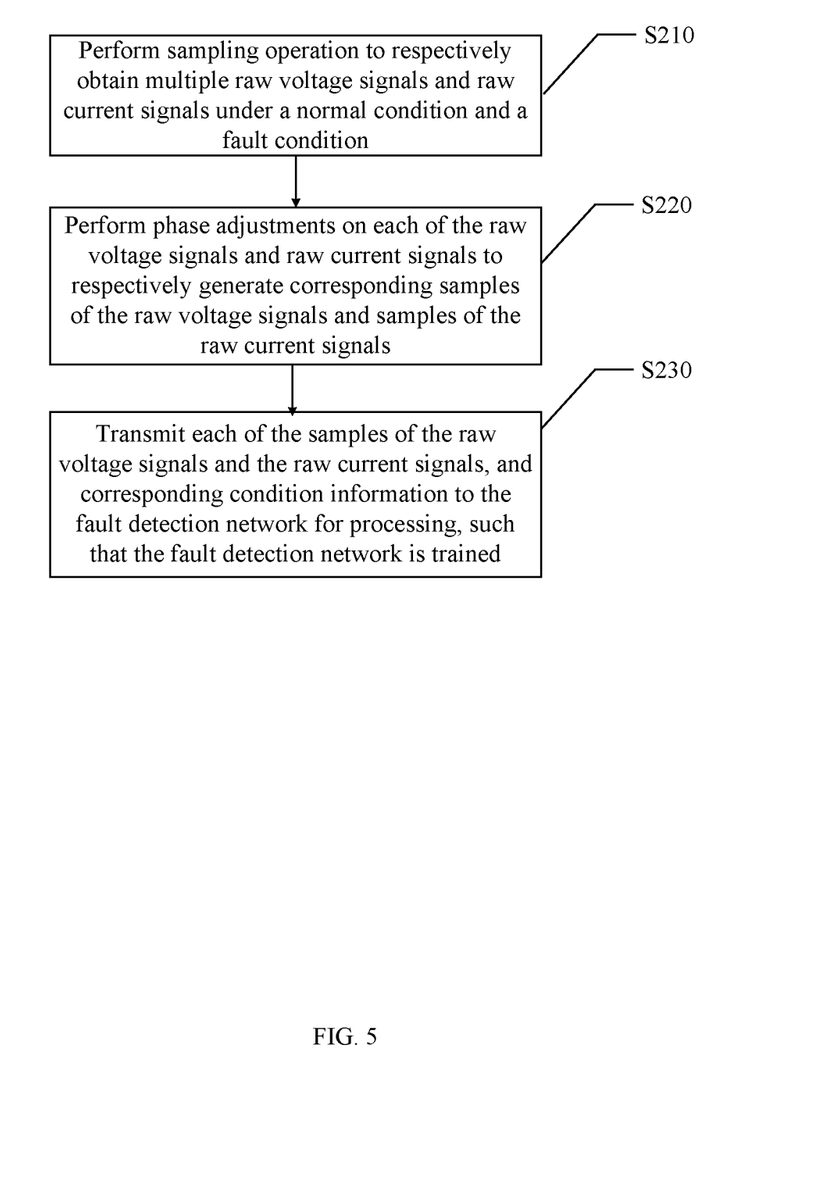
FIG. 5 is a flow diagram of an example training method for a fault detection network, in accordance with embodiments of the present invention.

Referring now to FIG. 5, shown is a flow diagram of an example training method for a fault detection network, in accordance with embodiments of the present invention. In this particular example, the fault detection network can be trained by the following steps. In S210, a sampling operation can be performed to obtain multiple raw voltage signals and raw current signals under normal and fault conditions. In S220, phase adjustments may be performed on each of the raw voltage signals and raw current signals to respectively generate samples of the voltage signal and samples of the current signals. In S230, each of the samples of the voltage signal and the current signal, and corresponding condition information, can be transmitted to the fault detection network for processing, such that the fault detection network is trained. The corresponding condition information can include an indication of a normal condition or a fault condition.

In another example, the samples of the current signal, the samples of the voltage signal, and corresponding condition information, can be transmitted to the fault detection network for processing. The fault detection network May process the amplitude information, phase information, frequency information, and other spectrum information of the electrical signal, in order to generate a fault detection result. Based on a condition corresponding to the fault detection result, the current sample of the current signal, and the current sample of the voltage sample signal, parameters in the fault detection network may be adjusted. When the fault detection network is able to generate a fault detection result that matches the corresponding condition, the training of the fault detection network is concluded.

In particular embodiments, a first voltage signal and a first current signal are obtained by performing a sampling operation on a circuit path. The phases of the first voltage signal and the first current signal can be adjusted to obtain a second voltage signal and a second current signal. The second voltage signal and the second current signal may be input to a pre-trained fault detection network for processing, such that a fault detection result is obtained. When the fault detection result indicates presence of a fault, the circuit path can be operably disconnected. Therefore, a circuit fault can be detected based on phase information and amplitude information of the current signal and voltage signal in the circuit path. As a result, more viable information may be provided to the fault detection network, such that the accuracy of detection is improved.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of performing fault detection, the method comprising:
   a) performing a sampling operation to obtain a first voltage signal and a first current signal from a circuit path;
   b) performing a phase adjustment on the first voltage signal and the first current signal to generate a second voltage signal and a second current signal, wherein the performing the phase adjustment comprises determining a fundamental frequency of the first voltage signal, obtaining phase information of the first voltage signal corresponding to the fundamental frequency, and adjusting phases of the first voltage signal and the first current signal according to the phase information;
   c) transmitting the second voltage signal and the second current signal to a fault detection network that is pre-trained to accordingly process and generate a fault detection result; and
   d) operably disconnecting the circuit path when a fault is detected based on the fault detection result.

2. The method of claim 1, wherein the obtaining the phase information of the first voltage signal corresponding to the fundamental frequency comprises performing a discrete Fourier transformation on the first voltage signal to obtain the phase information of the first voltage signal.

3. A method of performing fault detection, the method comprising:
   a) performing a sampling operation to obtain a first voltage signal and a first current signal from a circuit path;
   b) performing a phase adjustment on the first voltage signal and the first current signal to generate a second voltage signal and a second current signal;
   c) transmitting the second voltage signal and the second current signal to a fault detection network that is pre-trained to accordingly process and generate a fault detection result;
   d) operably disconnecting the circuit path when a fault is detected based on the fault detection result;
   e) wherein the transmitting the second voltage signal and the second current signal to the fault detection network pre-trained to accordingly calculate and render the fault detection result comprises, after the phase adjustment, transmitting the second voltage signal, and the second current signal to the fault detection network; and
   f) wherein spectrum information of the second voltage signal and the second current signal are processed to obtain the fault detection result, and the spectrum information comprises phase information and amplitude information.

4. The method of claim 3, wherein the spectrum information further comprises frequency information.

5. The method of claim 1, wherein the phase adjustment on the first voltage signal and the first current signal further comprises, when a phase difference exists between a sampling clock of the first voltage signal and a sampling clock of the first current signal, performing the phase adjustment on the first current signal according to the phase difference.

6. The method of claim 1, wherein the phase adjustment on the first voltage signal and the first current signal further comprises, when there is no consistent phase correlation between sample rates for the first voltage signal and the first current signal and an operation frequency in the circuit path, performing the phase adjustment on the first current signal according to a random phase.

7. The method of claim 1, wherein the transmitting the second voltage signal and the second current signal to the fault detection network pre-trained to accordingly calculate and render the fault detection result comprises:
  a) performing a frequency normalization on the second voltage signal and the second current signal;
  b) transmitting the second voltage signal and the second current signal to the fault detection network after the frequency normalization; and
  c) obtaining the fault detection result from the fault detection network.

8. The method of claim 7, wherein the performing the frequency normalization on the second voltage signal and the second current signal comprises performing a spectrogram scaling on the second voltage signal and the second current signal through interpolation filtering or spline interpolation to normalize frequencies of the second voltage signal and the second current signal.

9. The method of claim 1, wherein the pre-training of the fault detection network comprises:
  a) performing sampling operation to respectively obtain multiple raw voltage signals and raw current signals under a normal condition and a fault condition;
  b) performing phase adjustments on each of the raw voltage signals and raw current signals to respectively generate corresponding samples of the raw voltage signals and samples of the raw current signals; and
  c) transmitting each of the samples of the raw voltage signals and the raw current signals, and corresponding condition information to the fault detection network for processing, such that the fault detection network is trained, wherein the corresponding condition information comprises an indication of the normal condition or the fault condition.

10. A fault detection device, comprising:
  a) a sampling module configured to sample to obtain a first voltage signal and a first current signal from a circuit path;
  b) a phase adjustment module configured to performing a phase adjustment on the first voltage signal and the first current signal to generate a second voltage signal and a second current signal;
  c) a processor configured to transmit the second voltage signal and the second current signal to a fault detection network pre-trained to accordingly process and generate a fault detection result, and to operably control a connectivity of the circuit path according to the fault detection result; and
  d) a frequency normalization module coupled to a first DFT unit and a second DFT unit, and being operably arranged to perform a spectrogram scaling on the second voltage signal and the second current signal through interpolation filtering or spline interpolation to normalize frequencies of the second voltage signal and the second current signal.

11. The fault detection device of claim 10, wherein the phase adjustment module comprises a phase locker configured to determine a fundamental frequency of the first voltage signal, and to obtain phase information of the first voltage signal corresponding to the fundamental frequency, and adjust phases of the first voltage signal and the first current signal according to the phase information.

12. The fault detection device of claim 11, wherein the phase locker comprises:
  a) a first frame buffer unit coupled to the sampling module, and being configured to buffer samples of the first voltage signal for at least one DFT cycle;
  b) wherein the first DFT unit is coupled to the first frame buffer unit, and being configured to perform a discrete Fourier transformation on the samples of the first voltage signal output from the first frame buffer unit to obtain the phase information, and to feedback the phase information to the first frame buffer unit; and
  c) the first frame buffer unit being configured to adjust a phase of the first voltage signal according to the phase information.

13. The fault detection device of claim 11, wherein the fault detection device further comprises:
  a) a second frame buffer unit respectively coupled to the sampling module and the phase locker, and being configured to buffer samples of the first current signal for at least one DFT cycle, and to adjust a phase of the first current signal according to the phase information to obtain a second current signal; and
  b) wherein the second DFT unit is configured to perform a discrete Fourier transformation on the samples of the second current signal.

14. The fault detection device of claim 13, wherein the second frame buffer unit is further configured to calculate a phase difference between a sampling clock of the first voltage signal and a sampling clock of the first current signal, and to adjust the phase of the first current signal according to the phase difference.

15. The fault detection device of claim 10, wherein the sampling module comprises:
  a) a voltage signal sampling circuit configured to sample from the circuit path to acquire the first voltage signal; and
  b) a current signal sampling circuit configured to sample from the circuit path to acquire the first current signal.

* * * * *